(12) United States Patent
Willkommen

(10) Patent No.: US 6,374,628 B2
(45) Date of Patent: Apr. 23, 2002

(54) COOLING DEVICE

(75) Inventor: Thomas Willkommen, Pfungstadt (DE)

(73) Assignee: Knuerr-Mechanik fuer die Elektronik Aktiengesellschaft, Munich (DE)

(*) Notice: Subject to any disclaimer, the term of this patent is extended or adjusted under 35 U.S.C. 154(b) by 0 days.

(21) Appl. No.: 09/761,651

(22) Filed: Jan. 18, 2001

(30) Foreign Application Priority Data

Jan. 19, 2000 (DE) .......................................... 200 00 863

(51) Int. Cl.⁷ .............................................. F25D 21/14
(52) U.S. Cl. ............................ 62/288; 62/291; 62/426
(58) Field of Search ........................... 62/285, 288, 291, 62/426

(56) References Cited

U.S. PATENT DOCUMENTS

| | | | |
|---|---|---|---|
| 3,524,328 A | * 8/1970 | Schuster | 62/291 |
| 4,000,779 A | * 1/1977 | Irwin | 62/285 |
| 4,950,316 A | * 8/1990 | Harris | 62/289 |
| 5,113,667 A | * 5/1992 | Sullivan | 62/291 |
| 5,410,891 A | * 5/1995 | Ripert | 62/286 |
| 5,784,896 A | * 7/1998 | Tronnes et al. | 62/285 |

* cited by examiner

Primary Examiner—William E. Tapolcai
Assistant Examiner—Mohammad M Ali
(74) Attorney, Agent, or Firm—Jacobson Holman, PLLC

(57) ABSTRACT

A cooling device having an air conduit for cooling air, which flows horizontally through a heat exchanger, for instance an evaporator, with vertically positioned fins, and with an air deflector, which is positioned below the evaporator and collects evaporator condensation water. For a troublefree cooling air flow and a controlled condensation water removal, the evaporator is placed on the air deflector in such a way that the evaporator fins extend up to the air deflector. The air deflector and evaporator are inclined, the inclination falling away to a free, rear edge of the air deflector directed into the air conduit.

17 Claims, 1 Drawing Sheet

COOLING DEVICE

BACKGROUND OF THE INVENTION

1. Field of the Invention

The invention relates to a cooling device for a switch or equipment cabinet with an air conduit for cooling air, which flows horizontally through a heat exchanger, e.g. an evaporator, with vertical fins, and provided with an air deflector positioned below the evaporator and receiving evaporator condensation water.

2. Description of the Related Art

In the case of switch cabinet cooling devices operating according to the principle of a compression refrigerating machine, condensation water can form in the area of the evaporator. The condensation water drips from the evaporator and is entrained by air flowing through the evaporator. In order to prevent any entry of condensation water into the switch cabinet, condensation water separating devices are known (DE 196 41 552 C1, DE 197 12 474 C1, DE 197 22 619 C2).

In addition, cooling devices for switch cabinets are known, in which the cooling air flows horizontally through the evaporator (ACU cooling device of KNÜRR-Mechanik for Elektronik AG). The condensation water flows along the vertical evaporator fins in the downwards direction and is collected on an air deflector. The air deflector and evaporator are precisely horizontally positioned. The air deflector is constructed as a trough open at the rear, so that the condensation water flows to the rear edge of the air deflector, where it drips in random manner and is entrained by the flowing cooling air.

It is consequently necessary to position between the evaporator and an air outlet one of the known condensation water separating devices, which increases costs and can lead to a disadvantageous influencing of the cooling capacity.

SUMMARY OF THE INVENTION

The object of the invention is to provide a cooling device, which ensures a troublefree cooling air flow and a controlled carrying off of condensation water and requiring no additional condensation water separating devices.

According to the invention this object is achieved in that a cooling device provided in particular for a switch cabinet, an equipment rack, distribution rack or server rack, which has a heat exchanger, in particular an evaporator with vertical fins, an air deflector below the evaporator for receiving the evaporator condensation water and an air conduit or an air guiding channel for the cooling air, is provided with an evaporator which is placed on the air deflector, the evaporator fins extending to the air deflector and the air deflector and the evaporator have an inclination directed towards a rear, free edge of the air deflector.

The invention is based on the principle of draining the condensation water in such a way that from the formation point on the surfaces of the evaporator pipes and the vertically positioned fins up to a condensation water trough or drain it is in contact with components or solids and that the cohesive forces which occur are strong enough with respect to the cooling air flow rate to ensure that the cooling air flowing past does not entrain condensation water droplets.

According to the invention an evaporator having vertically oriented cooling fins is so positioned on the air deflector that the evaporator fins extend up to the air deflector and are in contact therewith. Under the action of gravity, the condensation water deposited on the cooling fins slides to the lower edges of the fins and from there to the air deflector. According to the invention the air deflector and the evaporator are inclined, the inclination falling away to a free rear edge of the air deflector directed into the air conduit of the cooling device.

As a result of the air deflector and evaporator being rearwardly inclined, the condensation water can flow to the rear edge of the air deflector.

According to an advantageous development the rear edge of the air deflector is provided with a discharge channel, where the condensation water can flow under constant contact with the air deflector.

In a first construction the air deflector and the evaporator are rearwardly inclined, i.e. towards the rear edge of the air deflector and the discharge channel, which is e.g. shaped on an almost vertical leg, is inclined downwards towards a casing side wall. This prevents a damming up of condensation water.

If the discharge channel is extended up to at least one casing side wall, with the aid of a correspondingly dimensioned opening it is possible to ensure an outflow of condensation water along the casing side wall.

Appropriately in a lower area of the cooling device particularly below a fan, which is advantageously located in the area of an outlet for the cooling air flow, a condensation water channel is located in the vicinity of the casing side wall or a condensation water trough, e.g. in the vicinity of a rear wall.

At its free, lower end, the discharge channel can also be connected to a condensation water collecting device, e.g. a connecting piece or a funnel or can extend up to the same and is connected to a condensation water drain by means of the condensation water collecting device.

In an alternative construction a dripping edge is located in the area of the rear edge and is provided with at least one dripping point.

It is advantageous from the manufacturing standpoint for the dripping edge to be constructed as an almost vertical chamfer of the air deflector in the area of the rear edge. One or even two dripping points, which are preferably located on or close to the casing side walls, can be formed by a widening chamfer. The rearwardly inclined air deflector is then horizontal in the vicinity of the rear edge, but in the area of the dripping edge it is constructed with at least one slope to one of the casing side walls, so that the condensation water can slide along the dripping edge to the at least one dripping point.

If the dripping edge extends up to a casing side wall, the condensation water can flow thereon into a condensation water channel, which is in particular located below the fan in the vicinity of the casing side wall.

Alternatively the dripping point of the dripping edge can be connected by means of a condensation water drain with a rear wall of the cooler. Appropriately the condensation water drain is downwardly inclined, so that the condensation water can flow to the rear wall without any accumulation and passes along said rear wall into a condensation water trough.

It is also possible to position below the dripping point a collecting device and to connect the latter to a condensation water drain.

In a further alternative construction the air deflector and evaporator are not only rearwardly inclined to the rear wall, but are also inclined to one of the casing side walls, so that the condensation water flows to a rear, lower lying corner region of the air deflector.

It is appropriate for draining off the condensation water to lead the rear, lower corner region up to the adjacent casing side wall.

If the condensation water is not intended to flow on the casing wall downwards into a condensation water channel or trough, a collecting device can be provided and is connected to a condensation water drain. It can e.g. be inclined to the rear wall, so that the condensation water can flow downwards along the rear wall and be removed.

As a result of the constructional arrangement and the construction of the fin heat exchanger and air deflector, the cooling device according to the invention ensures the utilization of cohesive forces for a clearly defined, troublefree draining off of the condensation water. Condensation water separating devices are rendered superfluous, particularly if the air flow rate is set in such a way that a tearing off of condensation water droplets is prevented and the condensation water is in constant contact with the correspondingly constructed components. The cooled air returned into a cabinet or rack, e.g. switch cabinet with the aid of a fan contains no condensation water droplets entrained in uncontrolled manner.

BRIEF DESCRIPTION OF THE DRAWINGS

The invention is described in greater detail hereinafter relative to the highly diagrammatic drawings, wherein show.

DESCRIPTION OF THE PREFERRED EMBODIMENTS

Figure 1:
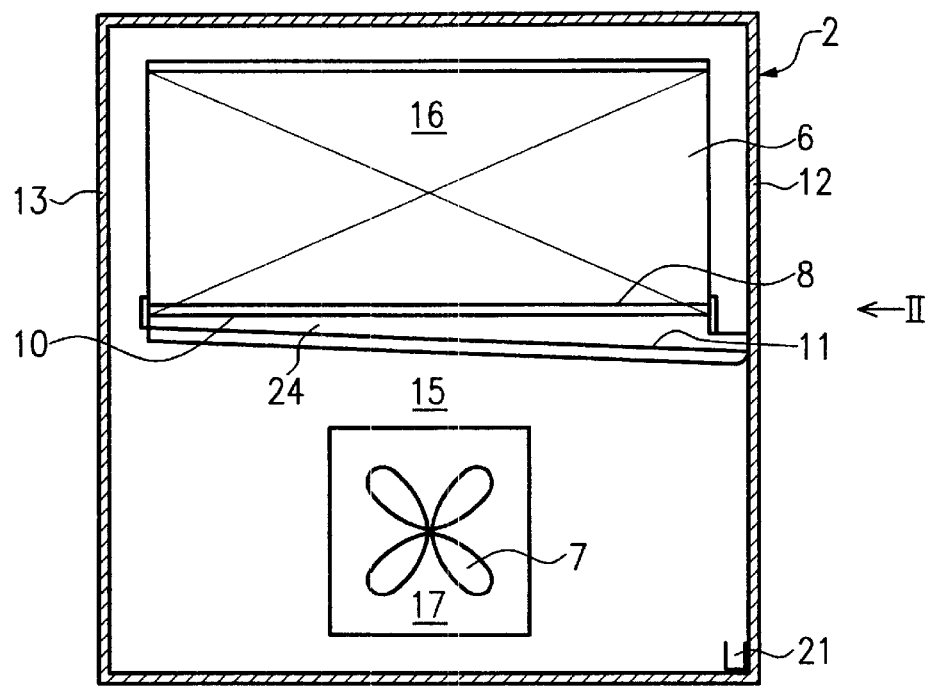
FIG. 1 is a view of a cooler according to the invention in the area of a cabinet-side casing wall.

FIG. 1 is a highly diagrammatic view of a cooling device 2 in the area of a cabinet-side casing wall 15 with an inlet 16 and an outlet 17. By means of the inlet 16 a cooling air flow is supplied from a not shown equipment cabinet to a heat exchanger, i.e. an evaporator 6.

The only diagrammatically shown evaporator 6 has vertically oriented cooling fins, which are traversed at right angles in winding manner by a cooling medium pipe (not shown). The lower edges of the cooling fins can be inclined under an acute angle to the horizontal.

The evaporator 6 is placed on a substantially horizontal air deflector 8 in such a way that the fins extend up to and contact the air deflector 8. The condensation water deposited on the cooling fins slides, under the action of gravity, to the lower edges of the fins and from there to the air deflector 8.

The air deflector 8 is trough-shaped and is open at the rear and is adjacent to a front, lower edge 10 of the air inlet 16. By means of a rear edge 9, the air deflector 8 projects into an air conduit 4 or air guiding channel, which extends from the air inlet 16 with the evaporator 6 for an almost horizontal air flow located therein to the air outlet 17. In the vicinity of the air outlet 17 is provided a blower or fan 7, which returns the cooling air cooled in the evaporator 6 to the not shown equipment cabinet.

The condensation water deposited on the evaporator 6 is passed to the rear edge 9 by the rearwardly inclined arrangement of the evaporator 6 and in particular the air deflector 8.

The embodiments shown in FIGS. 1 and 2 have a discharge channel 11 below the rear edge 9 and in which the condensation water can collect. In a construction particularly advantageous from the manufacturing standpoint the discharge channel 11 is shaped onto the air deflector 8.

As can be gathered from FIG. 1, the discharge channel 11 is inclined and in the present example is inclined on one side to a casing side wall 12 and extends up to said casing side wall 12. The condensation water collecting in the discharge channel 10 is in this way led up to the casing side wall 12 and can flow on the latter through a correspondingly constructed, not shown opening on the inside of the casing side wall 12 up to a condensation water channel 21 located on the bottom. The discharge channel 11 is positioned on a fixing leg 24 continuously widened up to the casing side wall 12.

FIG. 1 also shows that the discharge channel 11 can also have a roof-shaped construction and can fall away to the two casing side walls 12 and 13. In the vicinity of the side walls 12, 13 and in particular below the fan 10 are then located discharge two channels 21 (only one channel 21 is shown).

Figures 2, 3:
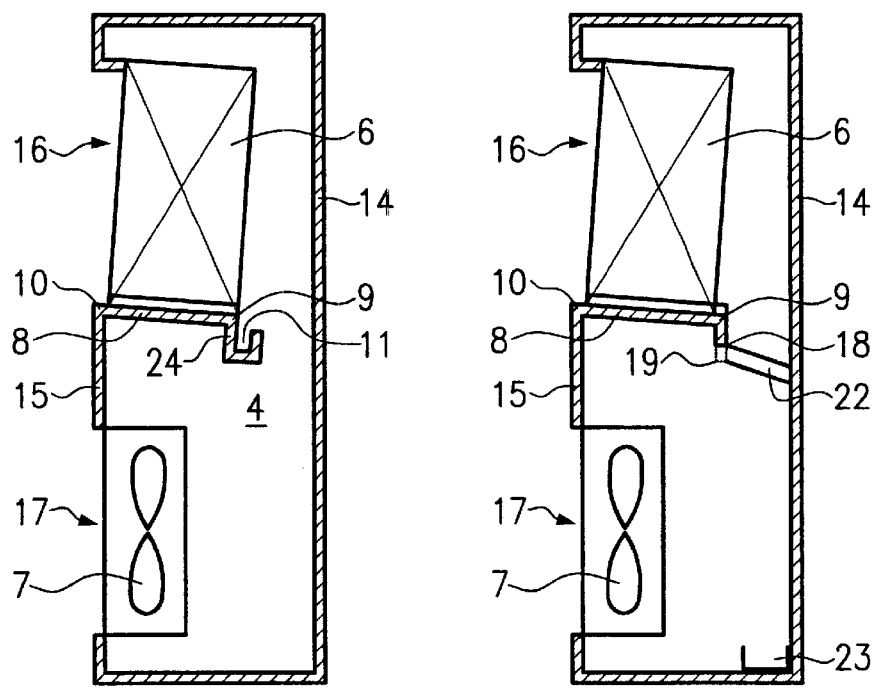
FIG. 2 is a side view along arrow II in FIG. 1.
FIG. 3 is a side view of a second embodiment of a cooler according to the invention.

In the embodiment according to FIGS. 1 and 2 the evaporator 6 and air deflector 8 only have an inclination directed towards a rear wall 14, but are otherwise virtually horizontal. In an alternative construction the evaporator 6 and air deflector 8 can be additionally inclined to one of the casing side walls 12 or 13 and then run e.g. parallel to the discharge channel 111 of FIG. 1.

In another embodiment according to FIG. 3, the discharge channel 11 on the rear edge 9 of the rearwardly inclined air deflector 8 is replaced by a dripping edge 18, which is oriented vertically in the embodiment shown. However, fundamentally it can also be inclined to the rear of the evaporator 6 or parallel to said rear.

In the same way as the discharge channel 11, the dripping edge 18 can widen in the direction of one casing side wall 12 or 13, so that the condensation water flowing away thereon passes to a dripping point 19, as is shown in broken line form in FIG. 3. The dripping point 19 can be constructed in the vicinity of a side wall 12 or 13, if the dripping edge 18 extends up to at least one of the casing side walls 12, 13. The condensation water can then flow away on the inside of the casing side wall 12 or 13 to the condensation water channel 21. FIG. 3 shows a further possibility for draining off the condensation water. In the latter the dripping point 19 of the dripping edge 18 is connected by means of a condensation water drain 22 to the rear wall 14. The condensation water carried off by means of the downwardly inclined condensation water drain 22 then flows on the inside of the rear wall 14 to a condensation trough tank 23 located at the bottom.

What is claimed is:

1. Cooling device for a switch or equipment cabinet, comprising:
    a front,
    a rear,
    an inlet in the front for supplying air,
    an air conduit extending from the inlet for cooling air,
    a heat exchanger and
    an air deflector,
    the heat exchanger being an evaporator, having vertically positioned fins,
    the cooling air flowing horizontally through the evaporator and
    the air deflector being positioned below the evaporator and receiving condensation water from said evaporator,
    wherein the evaporator is located on the air deflector and the evaporator fins extend to the air deflector, the air deflector being provided with a front edge and a rear free edge, the front edge being at the front of the cooling device, and the air deflector and evaporator being positioned with an inclination directed towards the rear free edge of the air deflector.

2. Cooling device according to claim 1, comprising a cabinet-side wall, a rear wall and two casing side walls, wherein the cabinet side wall is provided with an inlet and an outlet for the cooling air, the outlet is located below said inlet, and the evaporator is positioned in the inlet and in the outlet is located a fan.

3. Cooling device according to claim 2, wherein in the area of the rear edge the air deflector has a dripping edge leading the condensation water to at least one dripping point.

4. Cooling device according to claim 3, wherein the dripping edge is inclined to one of the casing side walls.

5. Cooling device for a switch or equipment cabinet, comprising:

an air conduit for cooling air, a cabinet-side wall, wherein the cabinet side wall is provided with an inlet and an outlet for the cooling air, the outlet being located below said inlet, a fan located in the outlet, a rear wall, two casing side walls, a heat exchanger and an air deflector, wherein the air deflector is trough-shaped and is open at the rear, extends over the entire width of the inlet and the evaporator and is connected at the front to a lower edge of the inlet, the heat exchanger being an evaporator, having vertically positioned fins, and being positioned in the inlet, the cooling air flowing horizontally through the evaporator and the air deflector being positioned below the evaporator and receiving condensation water from said evaporator, wherein the evaporator is located on the air deflector and the evaporator fins extend to the air deflector, the air deflector being provided with a rear free edge and the air deflector and evaporator being positioned with an inclination directed towards the rear free edge of the air deflector.

6. Cooling device according to claim 5, wherein the air deflector and evaporator are inclined to one of the casing side walls and the condensation water collects in a rear, lower corner region of the air deflector.

7. Cooling device according to claim 6, wherein the lower corner region of the air deflector extends up to at least one of the adjacent casing side walls and the condensation water flows along the said walls into a condensation water channel, which is positioned below the fan in the vicinity of the casing side walls.

8. Cooling device according to claim 7, wherein a collecting device is positioned below the lower corner region of the air deflector.

9. Cooling device according to claim 8, wherein the collecting device is connected to one of the casing side walls and the condensation water flows along the casing side wall into the condensation water channel.

10. Cooling device according to claim 9, wherein the collecting device is connected to a condensation water drain.

11. Cooling device for a switch or equipment cabinet, comprising:

an air conduit for cooling air, a cabinet-side wall, wherein the cabinet side wall is provided with an inlet and an outlet for the cooling air, the outlet being located below said inlet, a fan located in the outlet, a rear wall, two casing side walls, a heat exchanger and an air deflector, wherein the rear edge of the air deflector is provided with a discharge channel for condensation water, the heat exchanger being an evaporator, having vertically positioned fins, and being positioned in the inlet, the cooling air flowing horizontally through the evaporator and the air deflector being positioned below the evaporator and receiving condensation water from said evaporator, wherein the evaporator is located on the air deflector and the evaporator fins extend to the air deflector, the air deflector being provided with a rear free edge and the air deflector and evaporator being positioned with an inclination directed towards the rear free edge of the air deflector.

12. Cooling device according to claim 11, wherein the discharge channel has an inclination to at least one of the casing side walls.

13. Cooling device according to claim 12, wherein at least one end of the discharge channel extends up to one of the casing side walls.

14. Cooling device according to claim 12, wherein at least one end of the discharge channel extends up to a condensation water collecting device, which is connected to a condensation water drain.

15. Cooling device for a switch or equipment cabinet, comprising:

an air conduit for cooling air, a cabinet-side wall, wherein the cabinet side wall is provided with an inlet and an outlet for the cooling air, the outlet being located below said inlet, a fan located in the outlet, a rear wall, two casing side walls, a condensation water channel positioned below the fan in the vicinity of the casing side walls, a heat exchanger and an air deflector having a rear edge, wherein in the area of the rear edge the air deflector has a dripping edge leading the condensation water to at least one dripping point, and wherein the dripping edge is inclined to one of the casing side walls, and wherein the dripping edge extends up to at least one of the casing side walls and the condensation water flows along the casing side wall into the condensation water channel, the heat exchanger being an evaporator, having vertically positioned fins, and being positioned in the inlet, the cooling air flowing horizontally through the evaporator and the air deflector being positioned below the evaporator and receiving condensation water from said evaporator, wherein the evaporator is located on the air deflector and the evaporator fins extend to the air deflector, the air deflector being provided with a rear free edge and the air deflector and evaporator being positioned with an inclination directed towards the rear free edge of the air deflector.

16. Cooling device according to claim 15, wherein the dripping point of the dripping edge is connected by means of a condensation water drain to said rear wall, said condensation water drain is inclined to the rear wall, and the condensation water flows along the rear wall into a condensation water trough, which is positioned below the fan in the vicinity of the rear wall.

17. Cooling device according to claim 16, wherein below the dripping point of the dripping edge is located a collecting device, which is connected to a condensation water drain.

* * * * *